US007207027B2

(12) United States Patent
Bohm et al.

(10) Patent No.: US 7,207,027 B2
(45) Date of Patent: Apr. 17, 2007

(54) ALGORITHMIC AND DATAFLOW GRAPHICAL REPRESENTATION OF MATLAB

(75) Inventors: Michael Bohm, West Linn, OR (US); Bradley Armstrong, Washougal, WA (US)

(73) Assignee: Xilinx, Inc., San Jose, CA (US)

( * ) Notice: Subject to any disclaimer, the term of this patent is extended or adjusted under 35 U.S.C. 154(b) by 188 days.

(21) Appl. No.: 11/022,081

(22) Filed: Dec. 23, 2004

(65) Prior Publication Data

US 2005/0172259 A1 Aug. 4, 2005

Related U.S. Application Data

(60) Provisional application No. 60/533,989, filed on Dec. 30, 2003.

(51) Int. Cl.
*G06F 17/50* (2006.01)
*G06F 9/455* (2006.01)
*G06F 9/44* (2006.01)

(52) U.S. Cl. ............................ 716/18; 716/11; 717/100
(58) Field of Classification Search .................... 716/1, 716/11, 18; 717/100
See application file for complete search history.

(56) References Cited

U.S. PATENT DOCUMENTS

| 6,256,676 | B1 * | 7/2001 | Taylor et al. ................ 709/246 |
| 6,425,121 | B1 * | 7/2002 | Phillips ....................... 717/109 |
| 6,490,545 | B1 * | 12/2002 | Peng ............................ 703/13 |
| 6,883,147 | B1 * | 4/2005 | Ballagh et al. ................. 716/1 |
| 7,000,213 | B2 * | 2/2006 | Banerjee et al. .............. 716/18 |
| 7,003,751 | B1 * | 2/2006 | Stroomer et al. ............. 716/11 |
| 2004/0004629 | A1 * | 1/2004 | Hamilton et al. ........... 345/700 |
| 2004/0181385 | A1 * | 9/2004 | Milne et al. .................. 703/14 |

* cited by examiner

*Primary Examiner*—Thuan Do
*Assistant Examiner*—Magid Y. Dimyan
(74) *Attorney, Agent, or Firm*—David D. Schumann; LeRoy D. Maunu

(57) ABSTRACT

The present invention relates to a graphical user interface for a system that compiles MATLAB models for synthesis into register transfer level code. The graphical user interface provides a visual representation of the design in a manner that allows the user to more easily understand the algorithm being modeled. From this interface, the user may also modify the type, size and dimensions of variables from dialog boxes. The system allows the user to efficiently compare and verify a fixed-point design versus the MATLAB design. The interface allows the user to then make further changes to the design, or synthesize the design into a register transfer level file.

15 Claims, 12 Drawing Sheets

ALGORITHMIC AND DATAFLOW GRAPHICAL REPRESENTATION OF MATLAB

RELATED APPLICATIONS

This application claims priority to U.S. Provisional Application Ser. No. 60/533,989, filed on Dec. 30, 2003, which is incorporated herein by reference in its entirety. This application relates to U.S. patent application Ser. No. 10/072,212 entitled, "System for Architecture and Resource Specification and Methods to Compile the Specification onto Hardware," filed on Feb. 7, 2002 by A. Nayak, et al., and U.S. patent application Ser. No. 09/770,541 entitled, "Method and Apparatus for Automatically Generating Hardware from Algorithms Described in MATLAB," filed on Jan. 26, 2001, by P. Banerjee, et al.. now U.S. Pat. No. 7,000,213 B2.

FIELD OF THE INVENTION

This invention relates to electronic design automation tools, and specifically to a graphical user interface for compiling MATLAB programs into hardware specific RTL files.

BACKGROUND OF THE INVENTION

Designers of electronic systems frequently use high-level language systems to model designs before committing them to hardware designs. For example, a designer may use MATLAB™, from The MathWorks, Incorporated of Natick, Mass. ("MATLAB"). MATLAB is a high-level algorithmic language that facilitates efficient mathematical modeling of systems. Unlike other languages such as C, MATLAB is dynamically typed, meaning that formal declarations for variables and constants are unnecessary. Additionally, MATLAB is array-based, where variable dimensions are determined at run-time. These aspects of MATLAB, among others, facilitate efficient modeling because the designer is not burdened with storage requirements and data typing.

FIG. 1 illustrates the MATLAB design flow 100. The MATLAB user, such as a designer, creates a mathematical model 110 of a design using floating-point number variables. This MATLAB model 110 may include several files: A MATLAB script file 130 where the model is expressed as an algorithm; a MATLAB function file 125 which includes various functions used by the script file; and a MATLAB coefficient file 120, which may be used as inputs to the algorithm. After the user creates an initial MATLAB model 110 by preparing a script file, and if necessary, function and coefficient files, the user may then execute the script file using the MATLAB environment 135. Upon executing the script file, the results may be displayed 140. The designer can examine the results and then make appropriate changes to the model 110 by modifying one of the files that comprise the model, such as the coefficient file 120 or the script file 130.

Dynamically typed, array-based languages such as MATLAB provide various efficiencies to the designer during the modeling stage allowing the designer to create mathematical models without the burden of defining variable size and shape for each variable used in the model. However, these same features create challenges during design synthesis. Synthesis generates a file that is implemented directly in hardware. Unlike the MATLAB model, this resulting hardware implementation may not contain variables of unknown size and shape.

For example, FIG. 2A illustrates the mapping of a MATLAB script file 208 to a synthesized hardware module 209. The hardware module 209 has an input port 203, and output port 207 and other elements that can be used to perform various functions, such as a gate array 205. The script file 208 maps elements onto the hardware module 209 in order to synthesize the design. For example, the data inputs 202 in the script file 208 are mapped onto physical hardware inputs 203, and data outputs 206 from the script file 208 are mapped onto physical hardware outputs 207. Similarly, various functions and modules in the script file 208, such as fir16tap 204, map to resources 205 in the hardware module 209.

So that the correct number of hardware elements such as registers, data lines, and storage devices is allocated for each variable in the MATLAB model, the size and shape of variables are determined in advance of implementing any synthesized model in hardware. The number of inputs and outputs required by the MATLAB model determines the number of physical inputs and outputs allocated in the hardware implementation. Likewise, variables in the MATLAB script file require particular allocations of size and shape depending upon their use in the MATLAB model, which is determined prior to implementation in hardware.

As discussed above, MATLAB does not require designers to define the size and shape of the variables. In order to obtain a hardware implementation of the MATLAB model, the size and shape of all undeclared variables is determined automatically. In some instances, the designer may override the automatic size and shape determination by specifying a size or shape for a particular variable. Additionally, other parameters related to variables, such as loop indices, initial and final values, may also be either automatically determined or manually specified by the designer. Presenting this information to the designer and allowing the designer to manually specify selected attributes and parameters in a clear and efficient manner is difficult.

The designer requires an interactive system to review and customize variables types, sizes and dimensions. The system should automatically present the design in a manner that represents the algorithm being modeled, allowing the designer to compare and verify the typed- and dimensioned-design, for example a design that can be implemented in hardware, against the MATLAB model to determine whether the variable sizes, types, and dimensions are appropriate. The designer should also be able to modify the variable types, sizes, and dimensions and compare the results.

SUMMARY OF THE INVENTION

The present invention provides a visual representation of the design in a manner that allows the designer to more easily understand the algorithm being modeled. The designer can also modify the type, size and dimensions of variables from dialog boxes. The system allows the designer to efficiently compare and verify a fixed-point design versus the MATLAB design. The designer may then make further changes to the design, or synthesize the design into a register transfer level ("RTL") file.

The user interface presents a display to the designer including multiple sections. The design flow section provides the designer with selectable icons for initiating various steps in the design process. For example, when the designer selects a project icon, a dialog box is presented to the designer for initiating the loading of a design file, such as a MATLAB model. The selection of an analyze icon initiates analysis of the loaded design file, including the process of determining the shape and size of variables in the design file. Selecting the verify icon begins the process of simulating the design and presenting the simulation results to the designer. By selecting a synthesize icon, the designer initiates a process of creating an RTL file from the simulated design.

After the analysis of the design file is complete, the project explorer section displays a hierarchical representation of the design file. The hierarchical representation includes several levels of design file elements. On the first level, the displayed elements are grouped in two three expandable subgroups, an analyzed design subgroup, an external dependency subgroup, and an output file subgroup. Within the analyzed design subgroup, programmatic design file elements, such as variables, functions and loops, are displayed on a second hierarchical level according to their type. For example, all variables are displayed in the variable subgroup, each variable displayed separately on a third hierarchical level. Similarly, loop elements are displayed in the loop subgroup, each element displayed separately on a third hierarchical level.

Selecting an element in the project explorer provides additional features. For example, highlighting a variable in the project explorer caused the viewer to display an instance of that variable in the script file. By highlighting elements in the project explorer, dialog boxes may be displayed allowing the designer to modified attributes of the highlighted element such as size, shape, and dimension.

The user interface also includes other features the display the design and allow different methods of controlling the design process. For example, the command line section provides an interactive display for presenting the run-time messages of a design process and providing for manual entry of commands to control the process. Further features of the invention, its nature and various advantages will be more apparent from the accompanying drawings and the following detailed description.

BRIEF DESCRIPTION OF THE DRAWINGS

The accompanying drawings illustrate several embodiments of the invention and, together with the description, serve to explain the principles of the invention.

DETAILED DESCRIPTION OF THE EMBODIMENTS

The present invention is now described more fully with reference to the accompanying figures, in which several embodiments of the invention are shown. The present invention may be embodied in many different forms and should not be construed as limited to the embodiments set forth herein. Rather these embodiments are provided so that this disclosure will be thorough and complete and will fully convey the invention to those skilled in the art.

Figure 1:
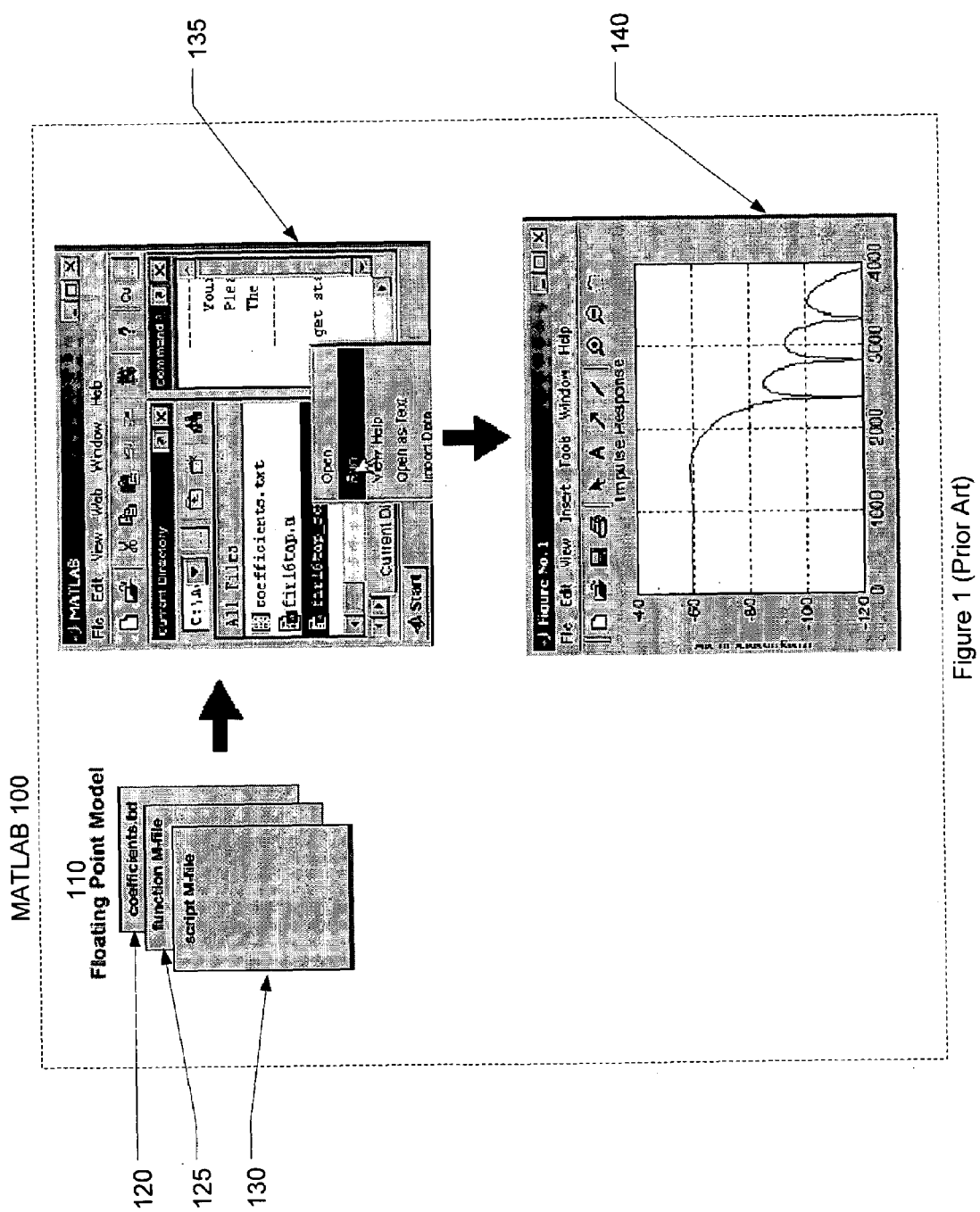
FIG. 1 is an illustration of the MATLAB design flow.
Figure 2A:
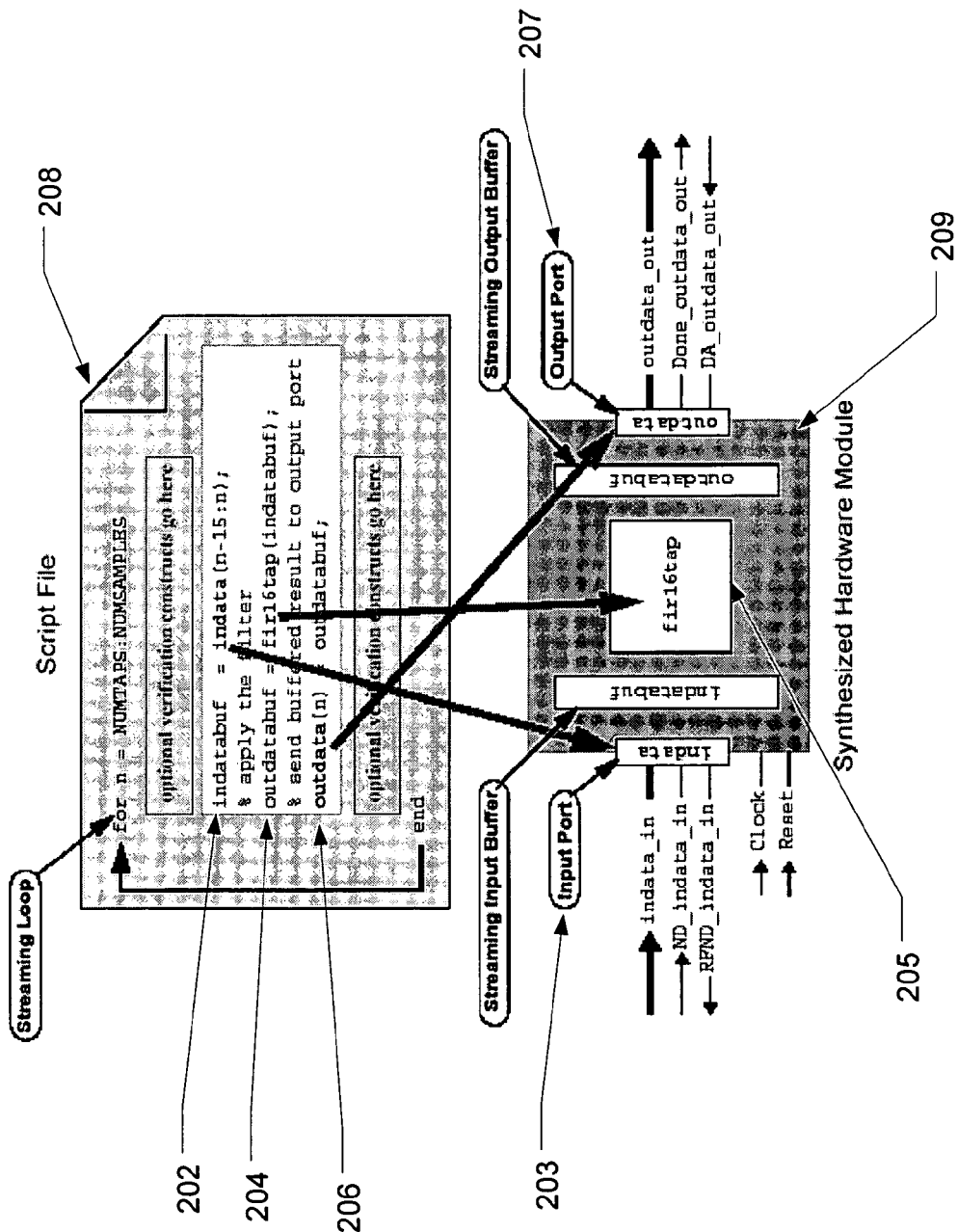
FIG. 2A is an example of mapping a script file onto a synthesized hardware module.
Figure 2B:
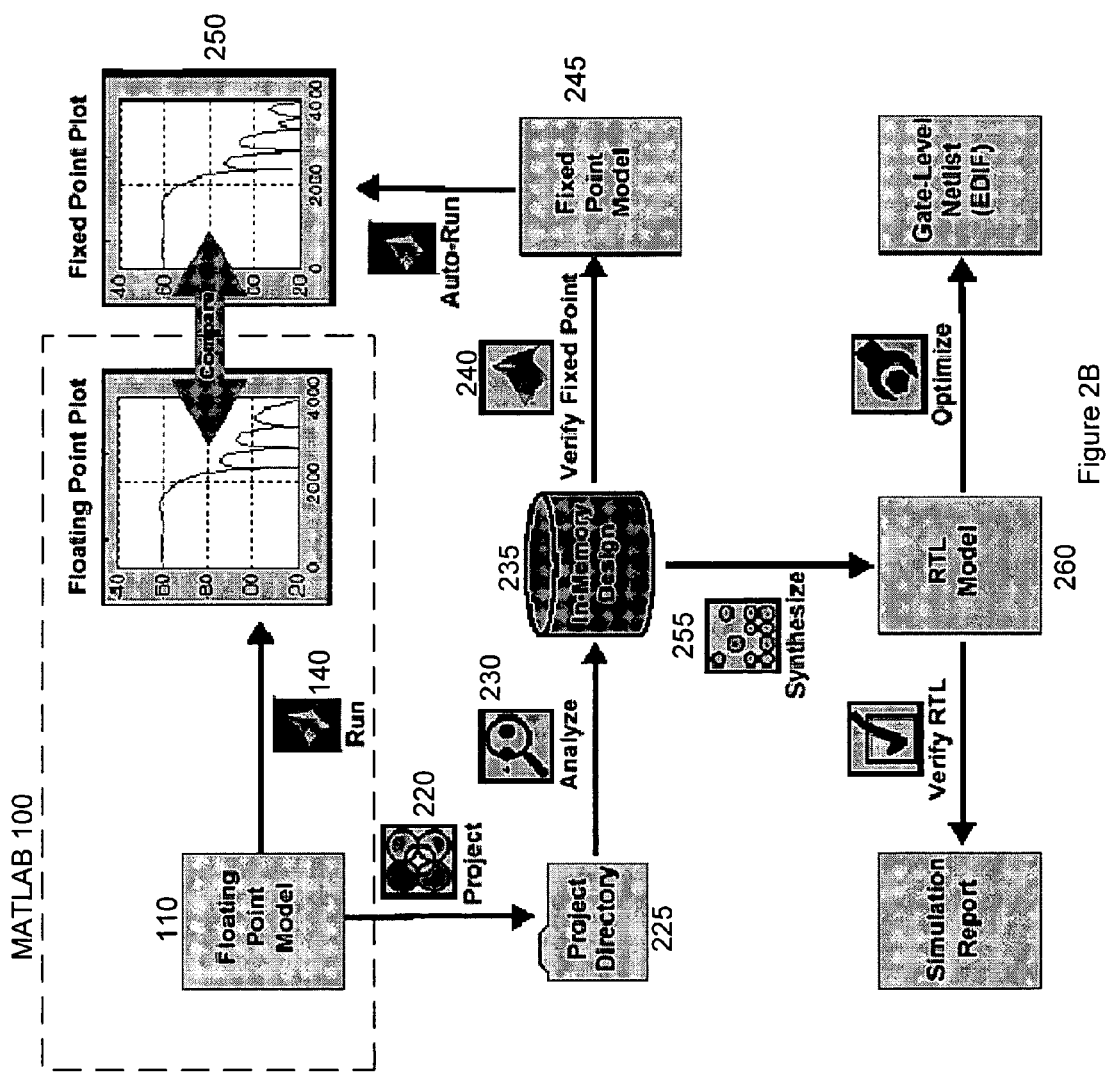
FIG. 2B is an illustration, according to one embodiment of the present invention, of a system for compiling a MATLAB program into an RTL model.

In one embodiment of the present invention illustrated in FIG. 2B, the system accepts a floating-point design 110 from MATLAB 100 upon selection of the Project button 220 in the graphical user interface. The system organizes the floating-point design 110 into a project directory 225. When the designer selects the Analyze button 230, the system assigns type, size, and dimensions to the variables in the design and optionally stores the analyzed design in memory 235. The system also determines external dependencies and creates one or more output files.

The designer can test the analyzed design and compare it to the floating-point design by selecting the Verify Fixed Point button 240. This selection creates a fixed-point design 245, invokes MATLAB application and displays the results 250. The designer can modify attributes and the script file and re-run the comparison. When the designer is satisfied that the fixed-point model meets the design objectives, the system can synthesize the design into and RTL model 260 in response to the designer selecting the Synthesize button 255.

Figure 2C:
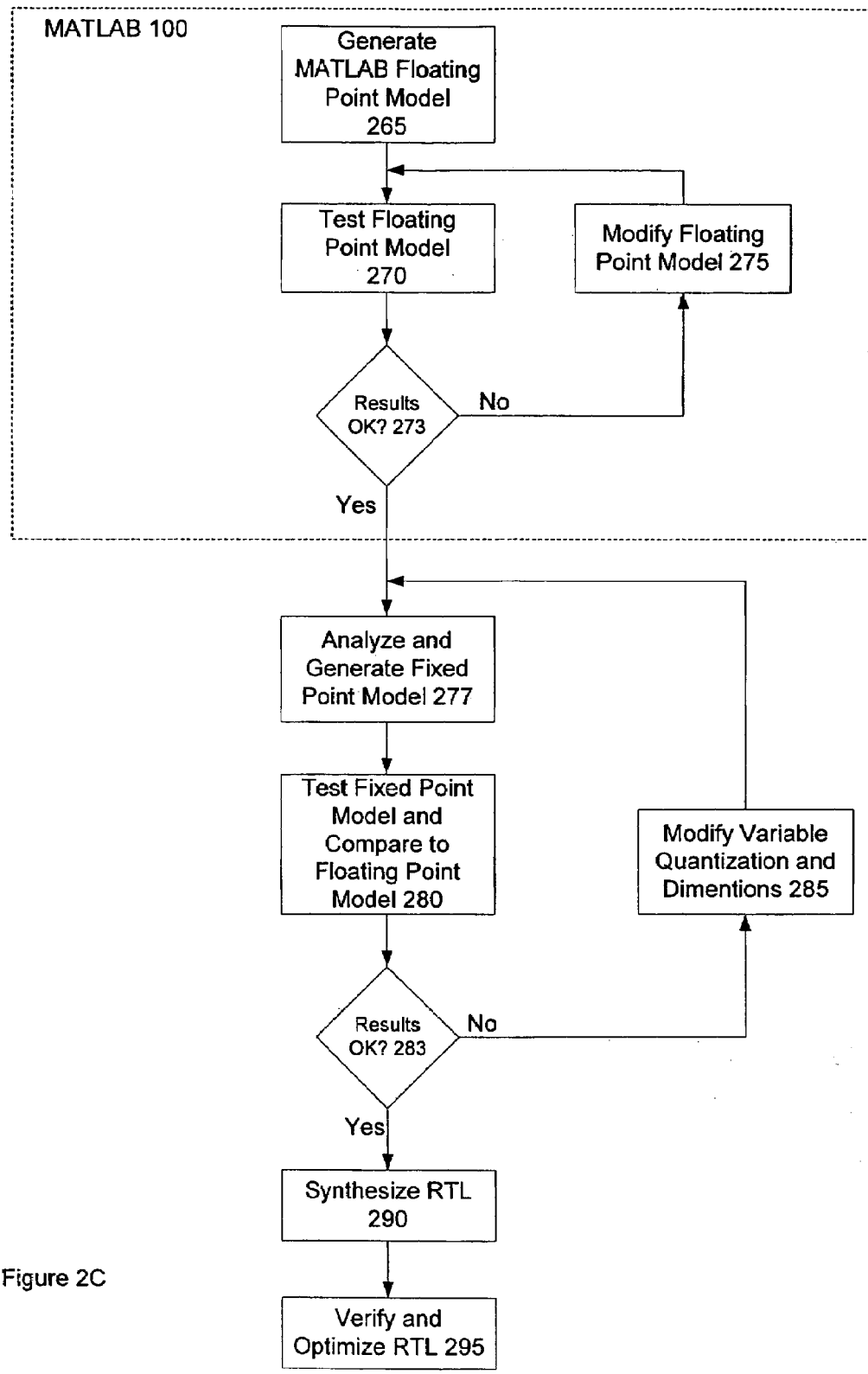
FIG. 2C is a flowchart illustrating the design flow for compiling a MATLAB model into an RTL file using one embodiment of the present invention.

FIG. 2C is a flowchart illustrating the design flow using one embodiment of the present invention to generate an RTL file from a MATLAB design. In MATLAB 100, the designer creates 265 a MATLAB floating-point model, also called a design. The designer then executes and tests 270 the MATLAB design 10 to determine 273 whether the design objectives were met. If the design objectives are not met, the designer modifies 275 the MATLAB floating-point design 10 and re-tests 270 the design until the design objectives are met.

Once the design objectives of the MATLAB floating-point design 10 have been met, the MATLAB floating-point design 10 is analyzed and a fixed-point model is generated 277 by the system. The fixed-point model may now be tested and compared 280 to the floating-point model. The designer then determines 283 whether the fixed-point model meets the design objectives. If the fixed-point model does not meet the design objectives, the designer modifies 285 variable attributes such as precision and dimensions in order to meet the design objectives. Then the fixed-point model is analyzed 277, tested and compared 280 to the floating-point model and the results are evaluated 283 again.

If the fixed-point model meets the design objectives, an RTL file is synthesized 290. After synthesis, the RTL file may be verified and optimized 295.

Figure 3A:
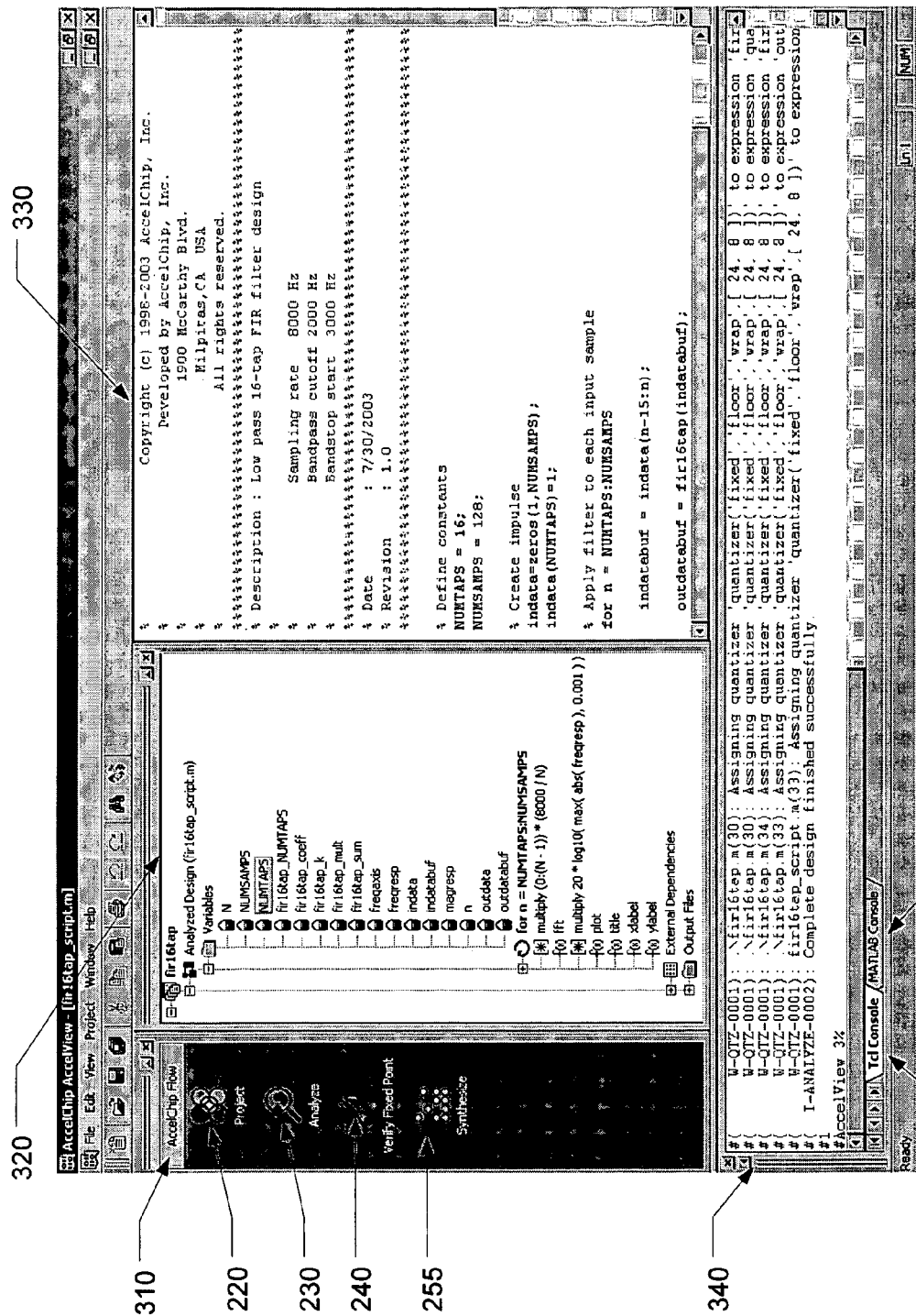
FIG. 3A is an illustration, according to one embodiment of the present invention, of a graphical user interface to a system for compiling MATLAB into an RTL model.

FIG. 3A illustrates a graphical user interface according to one embodiment of the present invention. The graphical user interface ("GUI") includes several panes including a design flow pane 310, a project explorer pane 320, a script and report viewer 330, and a lower pane 340 that includes tabs for a Tool Control Language (TCL) console 350 and a MATLAB console 360.

The design flow pane 310 comprises controls for the various steps of the design process. For example, a designer can initiate a design session by selecting the Project button 220. In response to selecting the Project button 220, the system will open a file dialog box providing the designer with a selection of files to choose.

Once the selection of files has been made, the designer can initiate the analysis process by selecting the Analyze button 230 from the design flow pane 310. The Analyze button 230 initiates the type and shape inferencing process where the system analyzes the script file variables and their use to determine the type and dimension of each of the variables. The system also performs other functions in response to the Analyze button 230 such as unrolling inferred loops, and determining which functions are used in the script file. Additionally, the system transforms floating-point numbers into a fixed-point representation. An example of the above inferencing and transform processes is set forth in U.S. patent application Ser. No. 09/770,541.

After the project has been analyzed, the designer can compare the analyzed project to the floating-point design by selecting the Verify Fixed Point button 240. This selection results in an automatic invocation of MATLAB to analyze the fixed-point design. After completing the MATLAB analysis, the system will present the designer with the results of both the floating-point design and the fixed-point design. The designer can then compare the results from both designs.

When the designer is satisfied that the fixed-point design meets the design requirements for example, the designer can synthesize the design into an RTL model 260 by selecting the Synthesize button 255. Other design flow processes may also be initiated by selecting controls from the design flow pane. For example, the designer may have a particular optimizer that modifies the RTL model for a particular target device. The control for initiating this process may be selected from design flow pane 310. Similarly, a process for verifying the RTL model may also be selected from the design flow pane 310. In this manner, the design flow pane 310 provides a single location for controls to initiate all the processes in the designer's design flow.

The project explorer pane 320 illustrates the design in an algorithmic fashion. For example, in this pane, all the variables and functions used in the script file are presented to a designer in a manner that represents the algorithm more intuitively than a script file. This pane will be discussed in greater detail below.

The script and report viewer 330 presents the section of particular files in response the designer's selection of various controls. In FIG. 3, the script file for the design is shown in the script and report viewer 330.

The lower part of the GUI contains the lower pane 340. The lower pane runs along the bottom portion of the GUI window, under the design flow pane 310, the project explorer pane 320, and the script and report viewer 330. The lower pane 340 contains multiple tabs that may be selected to present different views in the lower pane 340. For example, the Tcl Console tab 350 displays the system's command line messages and commands. The MATLAB Console tab 360 likewise allows the designer to view the MATLAB command line messages and commands. Both of these console tabs allow the designer to enter commands directly on the command line for either the system or MATLAB, or other processes of the design flow that have a command line interface.

Figure 3B:
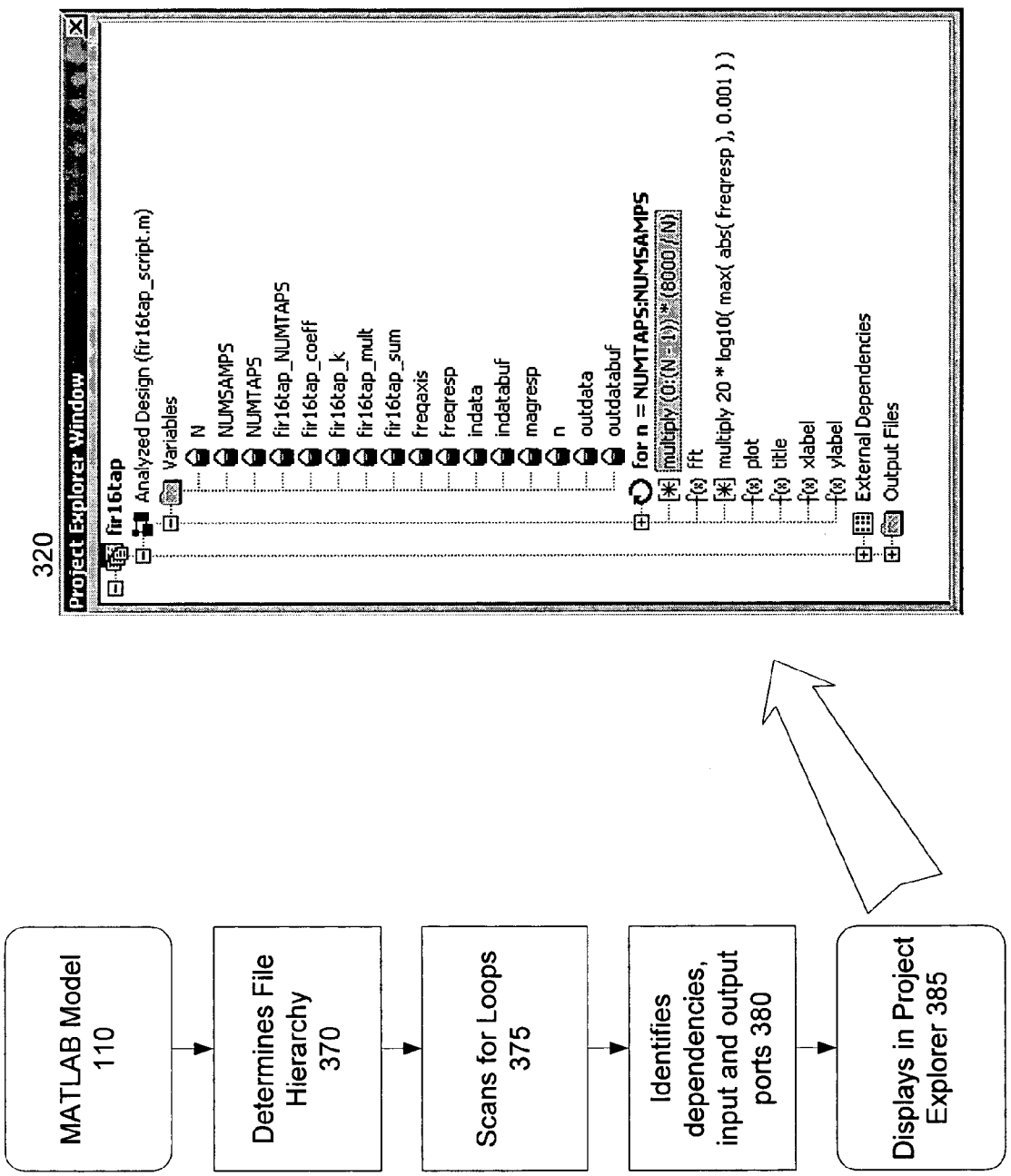
FIG. 3B is a flowchart of the process for displaying a MATLAB model in the project explorer window according to one embodiment of the present invention.

FIG. 3B is a flowchart illustrating the process that occurs to present the MATLAB design in the project explorer pane 320. The process begins 110 with the MATLAB design. The system then determines 370 the file hierarchy by analyzing the design to identify common programmatic constructs, such as variables and functions, and grouping common constructs together. After determining the file hierarchy, the file is scanned 375 to identify loops. For each loop, the system identifies 380 the loop dependencies and attributes, such as indices, maximum and minimum iteration limits, inputs to the loop, outputs from the loop, and functions used within the loop. The design is then visually presented 385 in the project explorer pane 320.

Figure 4:
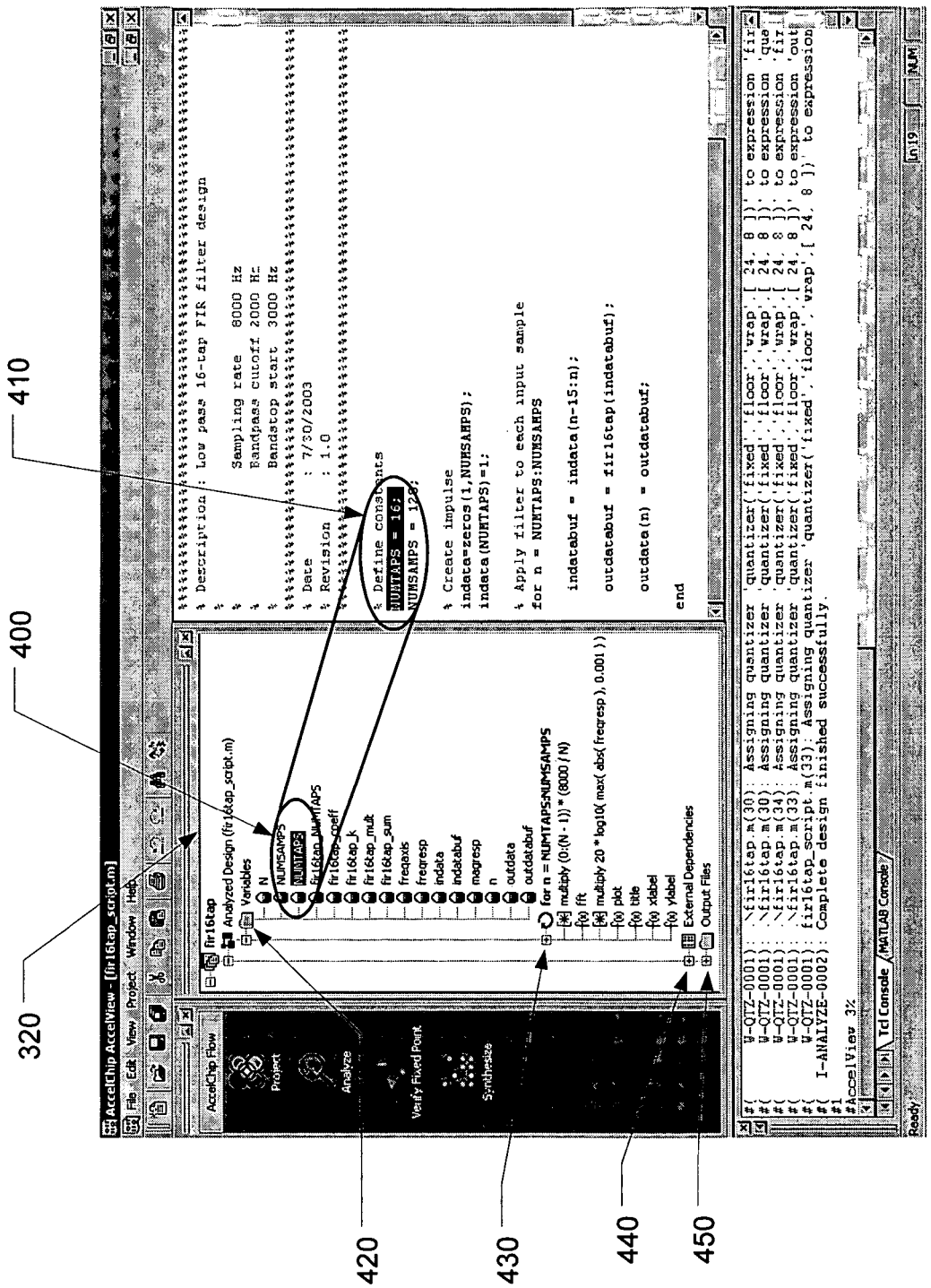
FIG. 4 is an illustration of the graphical user interface of FIG. 3, further depicting the relationship between a variable element in the project explorer pane and the script file in a second pane according to one embodiment of the present invention.

FIG. 4 illustrates some features of the project explorer pane 320 according to one embodiment of the present invention. The project explorer pane 320 presents the elements of the design in a hierarchical manner. The name of the design, "fir16tap" appears at the top of the pane. After the designer directs the system to analyze the design, other design elements appear below the file name. For example, in one embodiment all the variables used in the design appear in a "Variables" folder 420; loops 430, branching instructions and conditional statements are presented on the same level as the Variables folder 420, below the variables; below the loop 430 appears the various algorithmic functions used in the design.

Near the bottom of the project explorer pane 310, two other elements are shown: the External Dependencies 440 and the Output Files folder 450. The External Dependencies 440 element contains a list of those items used by the design that are not included in the script file itself. For example, the design may call a data file as input to the algorithm. The Output Files folder 450 contains files that include data such as the results of the execution of the algorithm.

The project explorer pane 320 provides the designer with the ability to quickly identify elements of the design, such as variables or loops. For example, highlighting a variable such as "NUMTAPS" 400 causes the system to locate the instance in the design where that variable is used, present the instance in the script and report viewer pane 330, and highlight the instance 410 in the script and report viewer pane 330. The designer is presented with a side-by-side visual representation of the use of the selected element in the design hierarchy and in the corresponding script file. In this manner, the designer can quickly locate and examine the instances of each element of the design. This form of visualization allows the designer to better understand the use of the element in the design.

Figure 5:
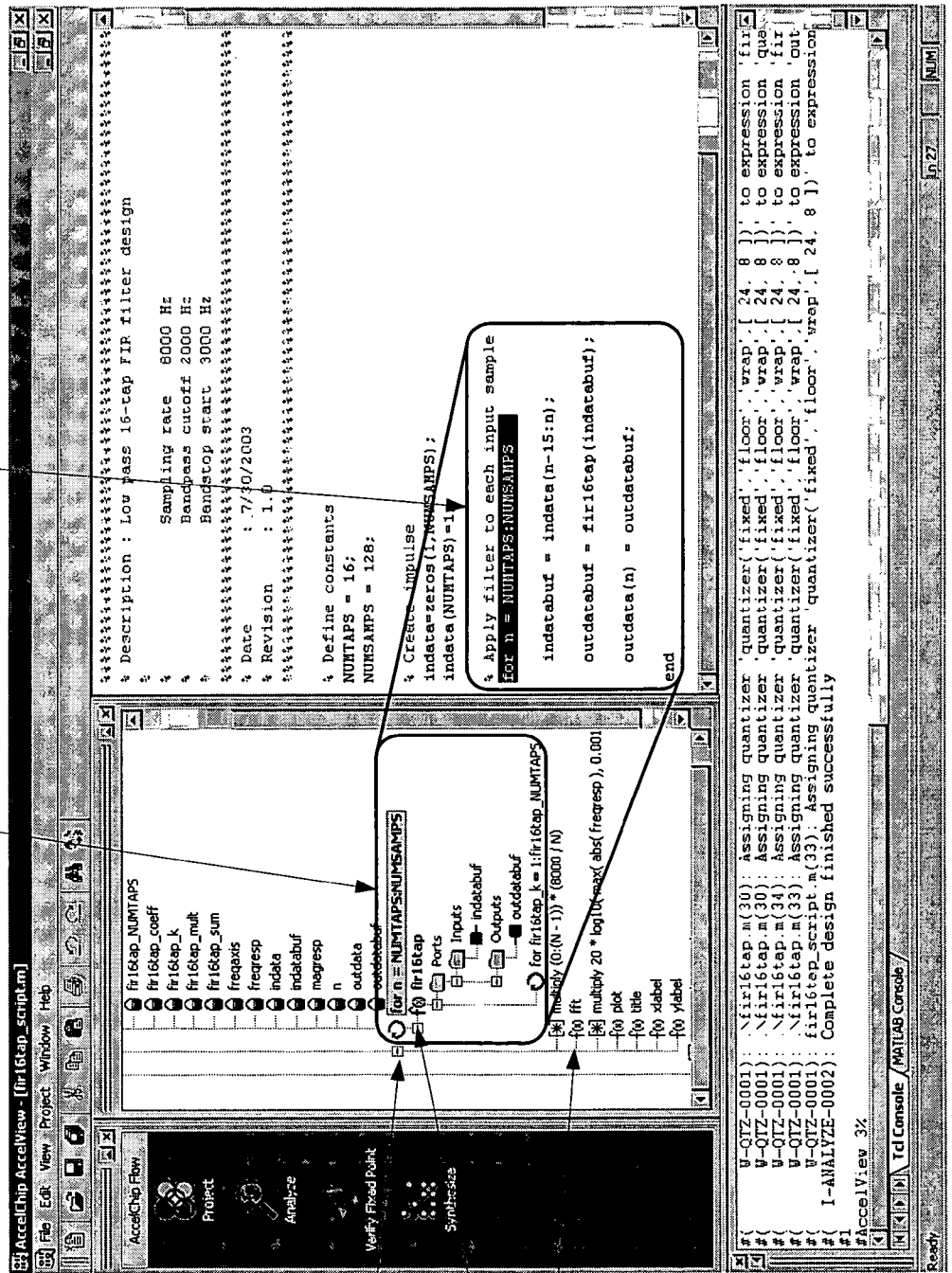
FIG. 5 is an illustration of the graphical user interface of FIG. 4, further depicting the relationship between a loop element in the project explorer pane and the script file in a second pane according to one embodiment of the present invention.

FIG. 5 illustrates the use of the project explorer pane 320 to identify a loop structure 500. Each element of the loop is presented in the project explorer window including the loop parameters, such as the loop index starting and ending values 520. Selecting the loop instruction 430 causes the system to locate the instance of the loop in the design and present the instance 510 to the designer in the script and report viewer pane 330.

Figure 6:
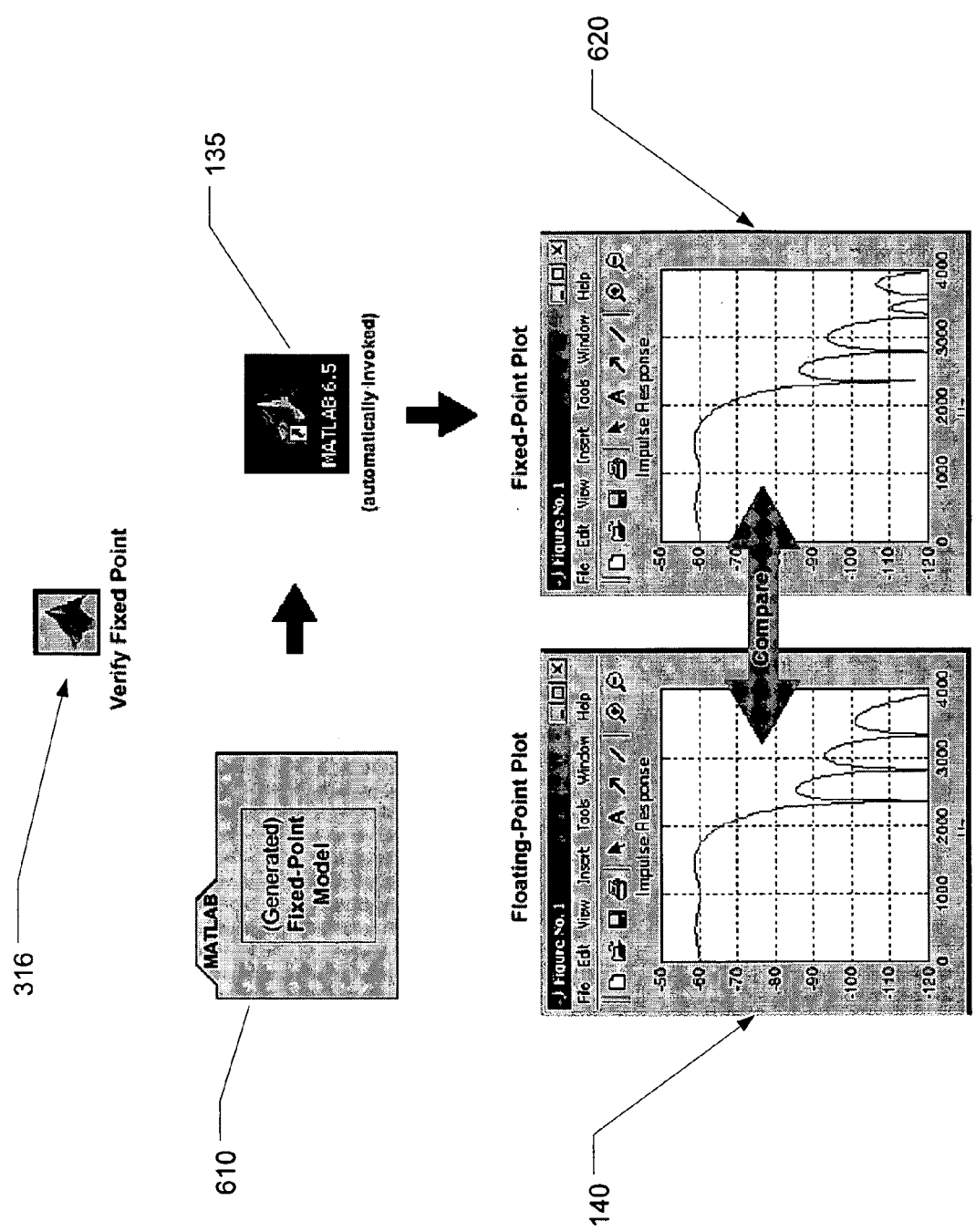
FIG. 6 is an illustration of the design flow when a designer selects the Verify Fixed Point control according to one embodiment of the present invention.

FIG. 6 illustrates the process flow that occurs when the Verify Fixed Point control 316 is selected. The analyzed design 610 including the fixed-point design is executed 135 by the MATLAB interpreter. The results 620 are then presented to the designer along side the results 140 from the floating-point design. By presenting the results of the two models in this manner, the designer can efficiently compare the two designs to determine whether the fixed-point design meets the design objectives.

Figure 7:
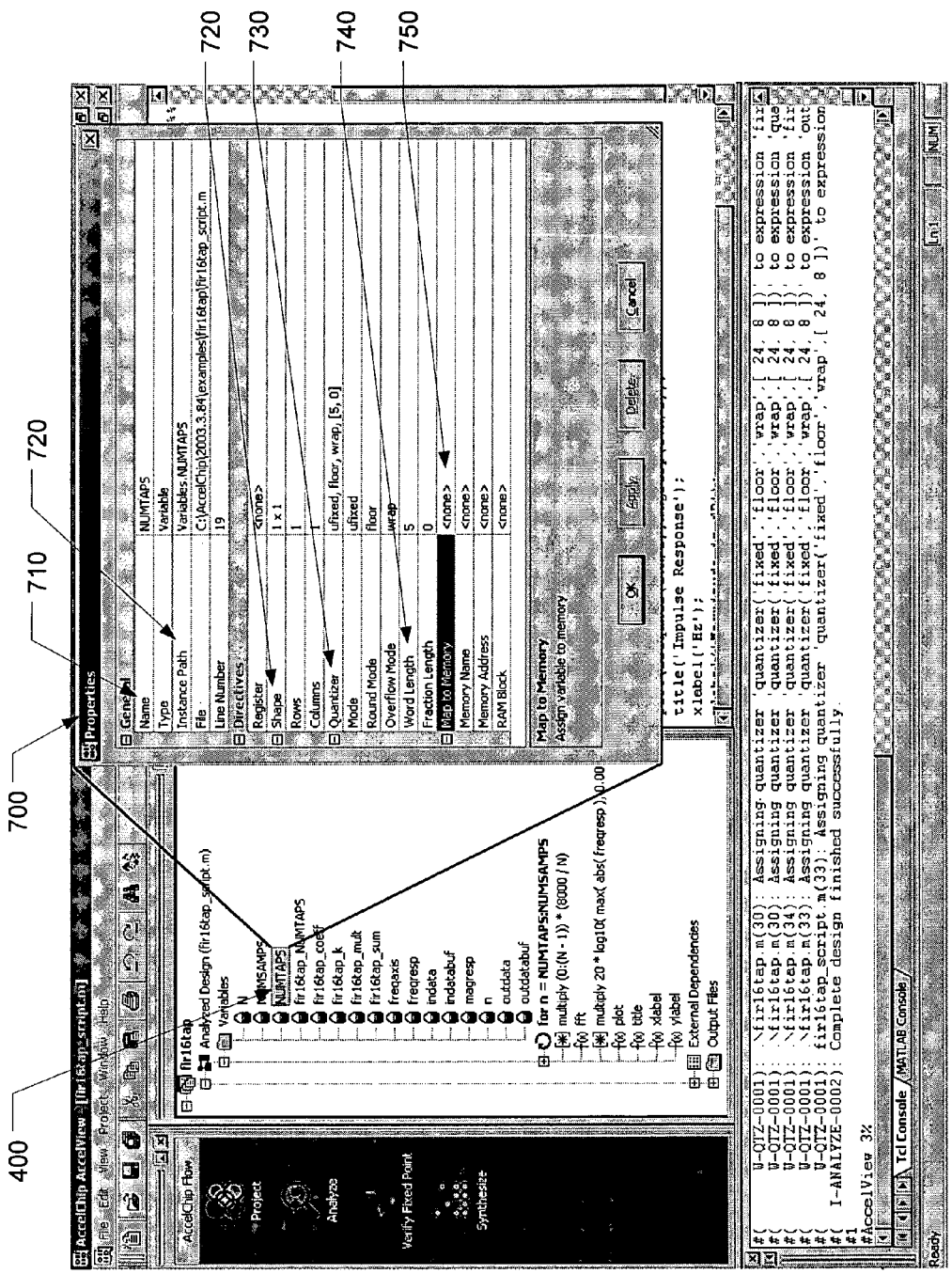
FIG. 7 is an illustration of the properties dialog box for a variable according to one embodiment of the present invention.

FIG. 7 illustrates an additional feature of the project explorer pane 320. A designer can quickly view and modify information about elements of the design using the project explorer pane 320, as opposed to having to rewrite the script file. For example, if a designer selects the NUMTAPS variable 400, the designer may open the "Properties" dialog box 700 by actuating the right button on the mouse. The Properties dialog box 700 presents the designer with the variable attributes. The variable name 710 appears at the top of the Properties dialog box 700. The instance path 720 indicating where the variable is used in the design is also shown.

Additionally, the Properties dialog box 700 present the designer with attributes assigned by the analysis process. For example, the "Shape" attribute 720 shows the dimensions of the variable. In this case, the variable is a 1×1 array. The designer can easily modify this dimension by entering a different dimension directly into the Properties dialog box 700. Similarly, precision and type information are shown in the "Quantizer" section 730. Note that the analysis process has assigned a length to this variable of five bytes 740. This length can be increased or decreased to accommodate the design requirements by entering a new length directly into the Properties dialog box 700.

Figure 8:
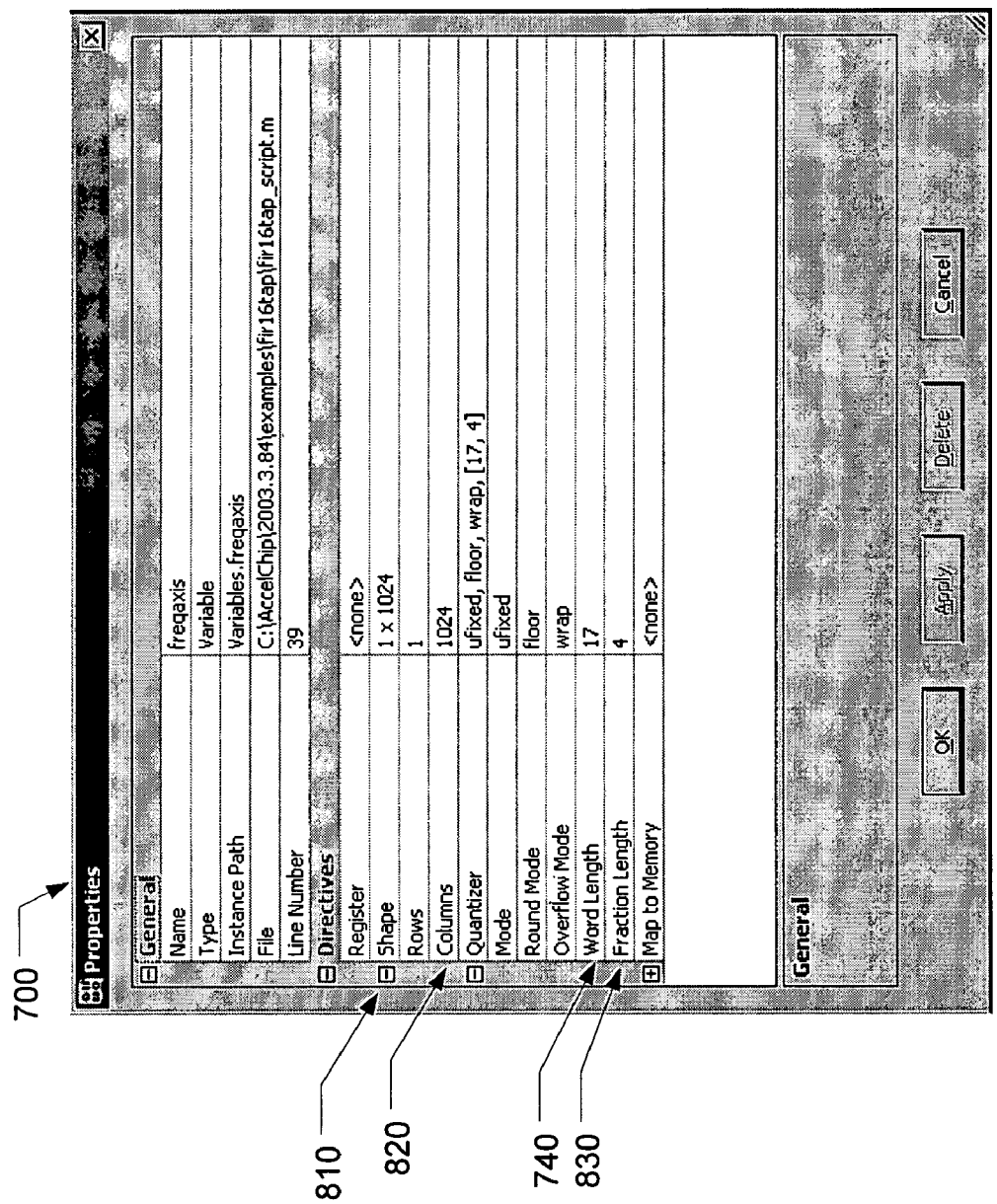
FIG. 8 is an illustration of the properties dialog box for a fixed point variable according to one embodiment of the present invention.

This feature can be particularly useful after comparing the fixed-point design to the floating-point design. For example, after comparing the two designs, the designer may need to adjust the precision of a variable to provide for more bits of precision, or may want to reduce the precision to save space in the target device. FIG. 8 illustrates the Properties dialog box 700 for a variable with both integer and fractional components. This variable is an array of 1024 values as illustrated by the Shape attribute 810 and reflected in the "Columns" attribute 820. The word length for this particular variable is presented by the "Word Length" attribute 740 as 17 bytes. "The Fractional Length" attribute 830 indicates that four of the 17 bytes are assigned to the fractional component of the value to be represented. If the designer needs to increase the precision of this value, the designer may enter a five or six directly into the Fractional Length attribute 830 section of the Properties dialog box 700.

Figure 9:
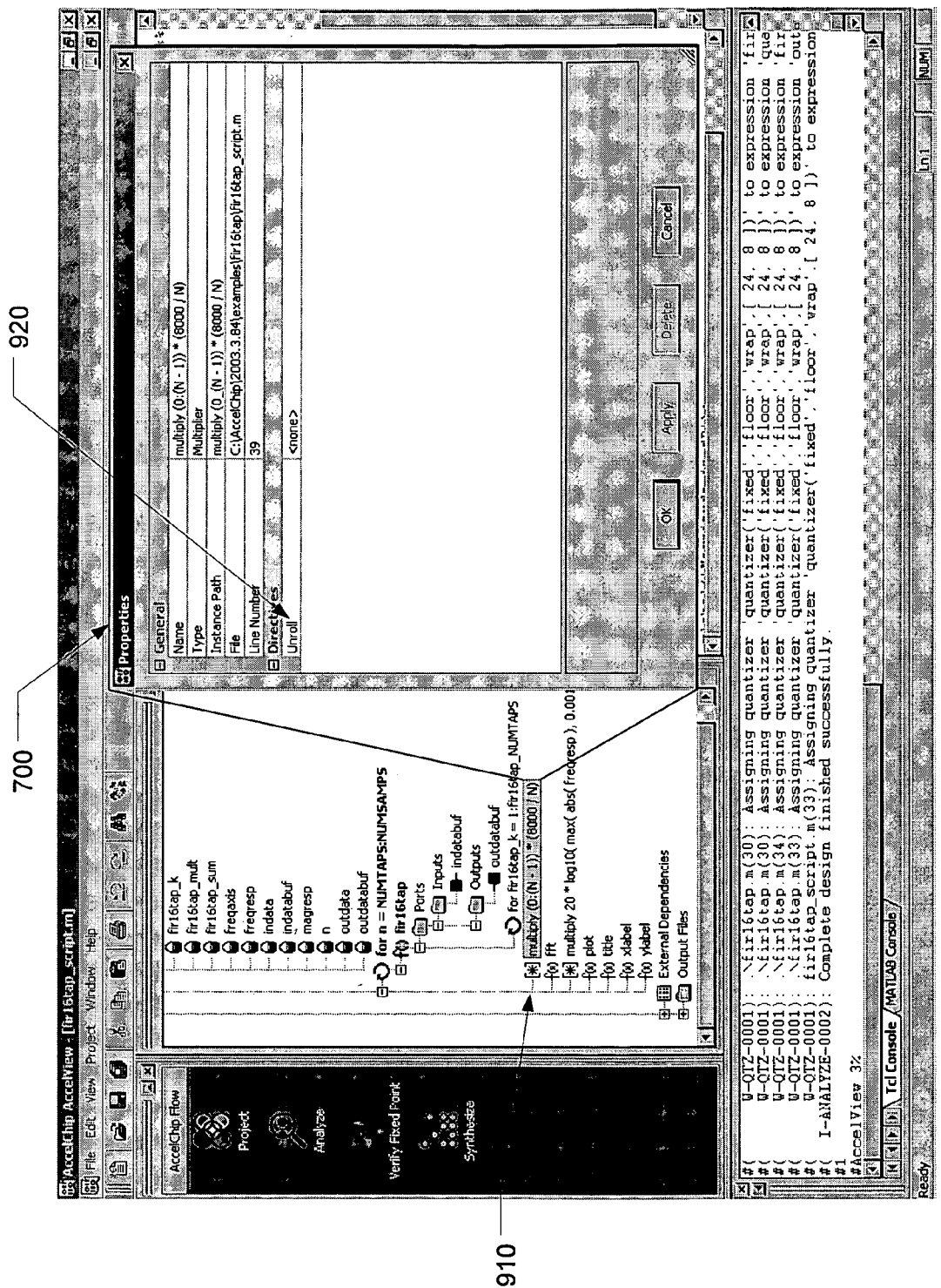
FIG. 9 is an illustration of the properties dialog box for a multiply instruction according to one embodiment of the present invention.

The designer may cause the system to display attributes of any element of the design through the project explorer 320. For example, FIG. 9 illustrates a Properties dialog box 700 for a multiply operation 910. In this case, the multiply operation 910 accepts an array as an input. Because the array consists of a number of discrete values that must be multiplied to complete the operation, an implied loop is created. In this manner, the first array values can be multiplied, then the next array values, and so on until all the discrete array values have been multiplied.

The attributes for the multiply operation are presented in the Properties dialog box 700 for this multiply operation 910. Notably, an "Unroll" attribute 920 is presented. This attribute indicates how many times the implied loop of the multiply operation 910 will execute. For example, the multiply operation 910 can be performed by a single multiply function. Alternatively, two or more multiply functions can be performed in parallel to increase throughput, at the expense of requiring more target hardware. The Unroll attribute 920 allows the designer to control this design trade-off by specifying the amount of parallel processsing that will be implemented in the target design. The designer may modify the amount of parallel processing by simply entering a new value for the Unroll attribute 910.

Having described embodiments of the Algorithmic and Dataflow Graphical Representation of MATLAB (which are intended to be illustrative and not limiting), it is noted that modifications and variations can be made by persons skilled in the art in light of the above teachings. It is therefore to be understood that changes may be made in the particular embodiments of the invention disclosed that are within the scope and spirit of the invention as defined by the appended claims and equivalents.

What is claimed:

1. A user interface for displaying a synthesized design file from a high-level algorithmic language, the user interface comprising:
    a project explorer for presenting the user with an algorithmic depiction of a MATLAB model; and
    wherein the project explorer presents the user with an algorithmic depiction of a selected design modeled from the high-level algorithmic language, wherein the algorithmic depiction comprises a list of hierarchically arranged design elements from the high-level algorithmic language model;
    wherein the list of hierarchically arranged design elements comprises a first level comprising an expandable list of at least one variable used by one or more functions, a list of at least one function used in the design and an expandable loop identifier for each loop used in the design; and
    a second expanded level for each loop in the design comprising
        a list of ports including an input and an output with at least one variable from the expandable list of at least one variable, and
        a least one loop parameter;
    a report section for presenting a first file associated with the MATLAB model;
    a command line section for displaying the output of processes selected by the user and for receiving commands from the user to control the design flow; and
    a design flow section providing a user with at least one selectable icon for invoking a selected phase of the design flow.

2. The user interface of claim 1, wherein the first file associated with the MATLAB model is at least one of a MATLAB script file, a synthesis report, an output report, and a test report.

3. The user interface of claim 1, wherein the project explorer further comprises:
    an expandable list of external dependencies, and
    an expandable folder for listing output files created in response to information received by the user in the design flow section.

4. The user interface of claim 1, wherein the design flow providing a user with at least one selectable icon for invoking a selected phase of the design flow comprises:
    a project icon for initiating a design session by presenting the user a dialog box for selecting a high-level algorithmic file from a list of files;
    an analyze icon for invoking a type and shape inferencing process for analyzing a script file and determining a type and dimension for each variable in the script file;

a verify icon for automatically invoking a simulation of the design and presenting the user with results from fixed-point and floating point models of the design; and a synthesize icon for synthesizing the design into a synthesized design file.

5. The user interface of claim 1, wherein the command line section comprises:
a set of selectable tabs for presenting the user with different views in the command line responses to the user's selection of a tab.

6. A user interface method for generating a synthesized design file from a high-level algorithmic language, the method comprising:
receiving a first user input from a design flow pane;
displaying in a viewer, a first file associated with a MATLAB model in response to receiving the first user input from the design flow pane;
displaying in a project explorer pane, a list of hierarchically arranged design elements from the MATLAB model in response to receiving the first user input from the design flow pane; and
displaying in the project explorer pane concurrent with display of the first file,
wherein the list of hierarchically arranged design elements includes an expandable list of at least one variable used by one or more functions, a list of at least one function used in the design and an expandable loop identifier for each loop used in the design, and for each loop in the design, a list of ports including an input and an output with at least one variable from the expandable list of at least one variable, and at least one loop parameter.

7. The user interface method of claim 6, further comprising:
invoking a simulation of fixed-point and floating point models in response to detecting the user's selection of a verify icon;
displaying results of the simulation of the fixed-point model; and
displaying results of the simulation of the floating-point model.

8. The user interface method of claim 6, further comprising:
receiving a user action selecting for modification a design element in the project explorer pane;
receiving a modification of a design element in the project explorer pane through a dialog with the user initiated in response to the detection of the user action; and,
modifying the design element in the file displayed in the viewer.

9. The user interface method of claim 6, further comprising:
synthesizing the design into a synthesized design file in response to receiving the user action selecting a synthesize icon in the design flow pane.

10. The user interface method of claim 6, wherein the first file is at least one of a MATLAB script file, an output file, a synthesis report, or a test report.

11. The user interface method of claim 6, further comprising displaying in the project explorer pane concurrent with display of the first file, wherein the list of hierarchically arranged design elements includes an expandable list of at least one variable used by one or more functions, a list of at least one function used in the design and an expandable loop identifier for each loop used in the design, and for each loop in the design, a list of ports including an input and an output with at least one variable from the expandable list of at least one variable, and a least one loop parameter.

12. The method of claim 6, further comprising:
receiving a user action highlighting a design element in the project explorer pane;
scrolling the file displayed in the viewer to display the first instance of the highlighted design element; and
highlighting the design element in the viewer.

13. A user interface for displaying a synthesized design file from a high-level algorithmic language, the user interface comprising:
a project explorer for presenting an algorithmic depiction of a MATLAB model;
wherein the project explorer presents an algorithmic depiction of a selected design modeled from the high-level algorithmic language, wherein the algorithmic depiction comprises a list of hierarchically arranged design elements from the high-level algorithmic language model;
wherein the list of hierarchically arranged design elements comprises a first level comprising an expandable list of at least one variable used by one or more functions, a list of at least one function used in the design and an expandable loop identifier for each loop used in the design, and for each loop in the design, a second level that includes a list of ports including an input and an output with at least one variable from the expandable list of at least one variable, and a least one loop parameter;
a report section for presenting contents of a first file associated with the MATLAB model concurrent with presentation of the algorithmic depiction; and
a command line section for displaying the output of selected processes and for receiving commands to control design flow concurrent with presentation of contents of the first file and the algorithmic description.

14. The user interface of claim 13, wherein the report section is configured to scroll the presented file to a first instance of a highlighted design element, and highlight the design element in the presented contents of the first file, in response to a user action that highlights the design element presented by the project explorer.

15. The user interface of claim 13, wherein the report section is configured to modify a design element in the presented contents of the first file, in response to a first user action selecting for modification the design element presented by the project explorer and a second user action of modifying the design element presented by the project explorer through a dialog initiated in response to the detection of the first user action.

* * * * *